(12) United States Patent
Chou

(10) Patent No.: US 6,445,572 B1
(45) Date of Patent: Sep. 3, 2002

(54) KEYPAD INCLUDING A MEMORY CARD READER

(75) Inventor: Chin-Wen Chou, Taipei (TW)

(73) Assignee: Shin-Jiuh Corporation, Taipei Hsien (TW)

( * ) Notice: Subject to any disclaimer, the term of this patent is extended or adjusted under 35 U.S.C. 154(b) by 104 days.

(21) Appl. No.: 09/610,971

(22) Filed: Jul. 6, 2000

(51) Int. Cl.[7] .............................. G06F 1/16; H05K 17/94
(52) U.S. Cl. ....................... 361/680; 361/683; 361/754; 400/472; 439/945
(58) Field of Search ................................ 361/680, 683, 361/737, 728, 752, 753, 754; 400/472, 477, 489; 439/945, 946

(56) References Cited

U.S. PATENT DOCUMENTS

| | | | | |
|---|---|---|---|---|
| 4,870,604 A | * | 9/1989 | Tatsuno ....................... 361/680 |
| 5,179,502 A | * | 1/1993 | Matsuda ...................... 361/680 |
| 5,227,615 A | * | 7/1993 | Oogita ........................ 361/680 |
| 5,278,779 A | * | 1/1994 | Conway et al. .............. 361/680 |
| 5,422,785 A | * | 6/1995 | Garrett et al. ............... 361/754 |
| 5,507,658 A | * | 4/1996 | Ho .............................. 361/754 |
| 5,597,316 A | * | 1/1997 | David et al. ................. 361/754 |
| 5,715,139 A | * | 2/1998 | Nakajima .................... 361/683 |
| 6,081,207 A | * | 6/2000 | Batio .......................... 361/680 |

* cited by examiner

*Primary Examiner*—Darren Schuberg
*Assistant Examiner*—Lisa Lea-Edmonds
(74) *Attorney, Agent, or Firm*—Bacon & Thomas

(57) ABSTRACT

A card insertable keypad includes a housing and a card inserting mechanism installed within the housing. When a memory card is inserted by the card inserting mechanism into the keypad, the data in the memory card can be sent to a computer for processing or data in the computer can be stored in the memory card.

9 Claims, 4 Drawing Sheets

KEYPAD INCLUDING A MEMORY CARD READER

BACKGROUND OF THE INVENTION

The present invention relates to a card insertable keypad, and especially to a keypad into which a memory or IC card may be installed.

Although the keyboards of notebooks and conventional keyboards have sufficient functions for general use, when new generation software is loaded into a computer, it is possible for the software to pen-nit other peripherals of the computer from being used so that the user must update these peripheral devices for running the new generation software. For example, when Windows 2000 is loaded into a computer, 20 hot keys are defined. The functions of these hot keys cannot be performed by a convention keyboard. Therefore, the user must update the keyboard or limit its use.

As a result, plug-in keypads have been invented, which serve to be connected with a personal computer or TV. The microprocessor in the personal computer or TV is set with a function for switching the hot keys and the Num-lock. If the hot-key or the Num-lock key is pressed, then a switching software will perform the functions of the hot-key or Num-lock key. Therefore, each key cap on the keypad is printed with at least two numerals, symbols, or indexes that may be selected by a user.

Many currently-used computer peripherals, such as personal digital assistants, digital cameras or MP3 players, use flash memory cards. As these memory cards serve to read or write data, they must be inserted in advance into a card reader, and a transmission line is connected to the card reader or the computer. Then, the computer may read data in the memory card or store data to the memory card. Therefore, when the user takes the device out, other than the computer peripherals, the user must further carry a card reader. This is very inconvenient.

To solve this problem, in some designs, card insertion functions are installed in a keyboard so that other than the function of inputting instructions, the keyboard has the function of a card reader. Thus, if a keyboard is used, the internal software will, in advance, scan the keys and inserted cards. If no card is inserted, the keyboard only performs the function of inputting instructions. If some cards are inserted, then the keyboard reads data from the card and the data is converted into USB compatible codes. Thus, the computer may read the data in the card.

Although, the aforesaid keyboard has the function of a card reader, only general IC cards can be inserted instead of flash memory cards. Therefore, if a flash memory card is used, a card reader must still be used.

SUMMARY OF THE INVENTION

Accordingly, the primary object of the present invention is to provide a card-insertable keypad, the keypad including card inserting means for receiving a memory card. The data in the memory card can be transferred to a computer or data can be read from a computer without being matched with a mainframe.

Another object of the present invention is to provide a card-insertable keypad, into which different memory cards can be inserted.

A further object of the present invention is to provide a card-insertable keypad, wherein the memory card is selectable from the group consisting of a compact flash memory, a smart media card, a multi-media memory card and a general IC card.

In order to achieve the aforesaid objects, the present invention provides a card-insertable keypad including a housing and a card inserting means installed within the housing. When the card inserting means receives a memory card, through the keypad, the data in the memory card can be sent to a computer for processing, or data in the computer can be stored in the memory card.

The various objects and advantages of the present invention will be more readily understood from the following detailed description when read in conjunction with the appended drawings.

DETAILED DESCRIPTION OF THE PREFERRED EMBODIMENTS

Figure 1:
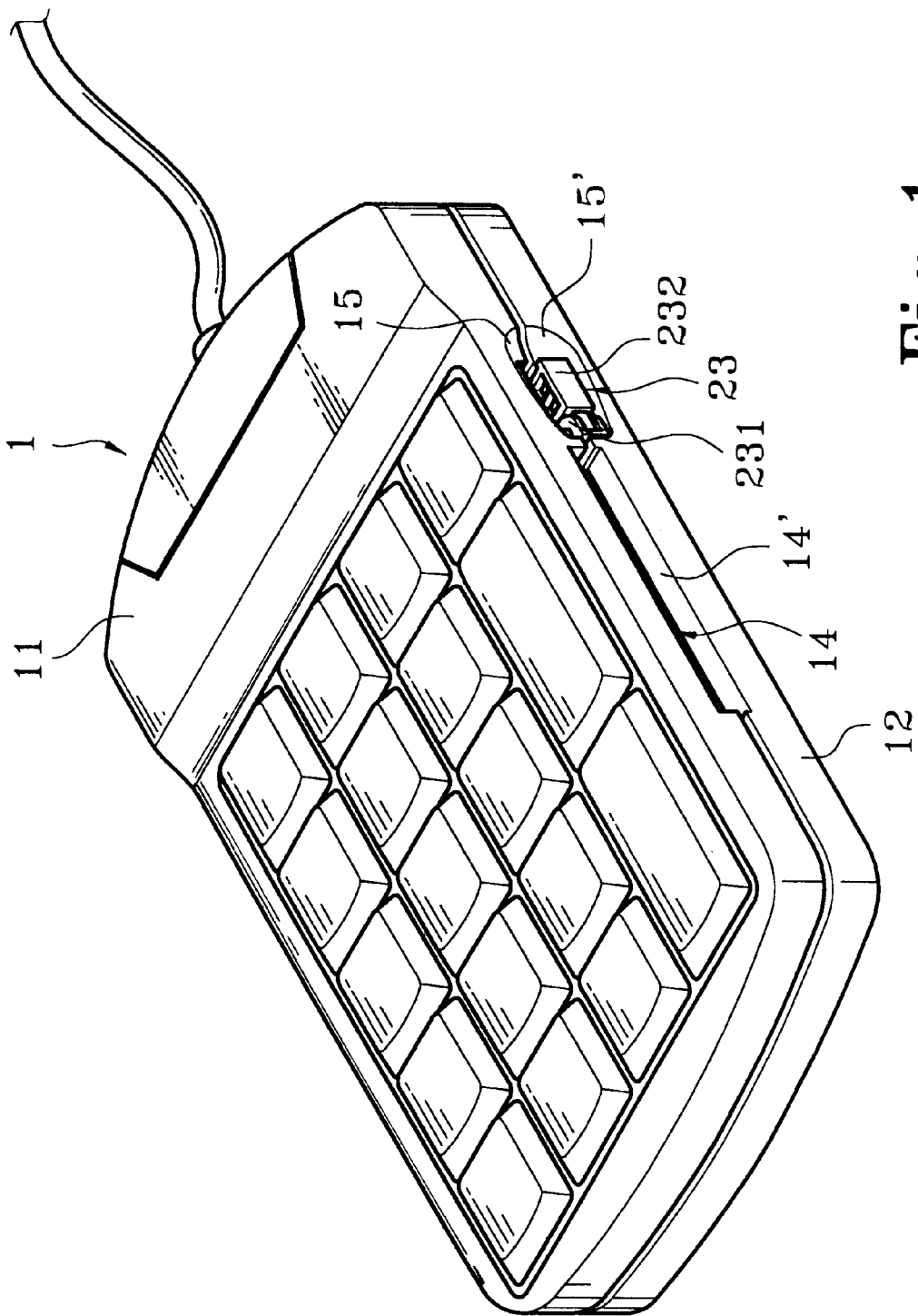
FIG. 1 is a perspective view of a preferred embodiment of the present invention.
Figure 2:
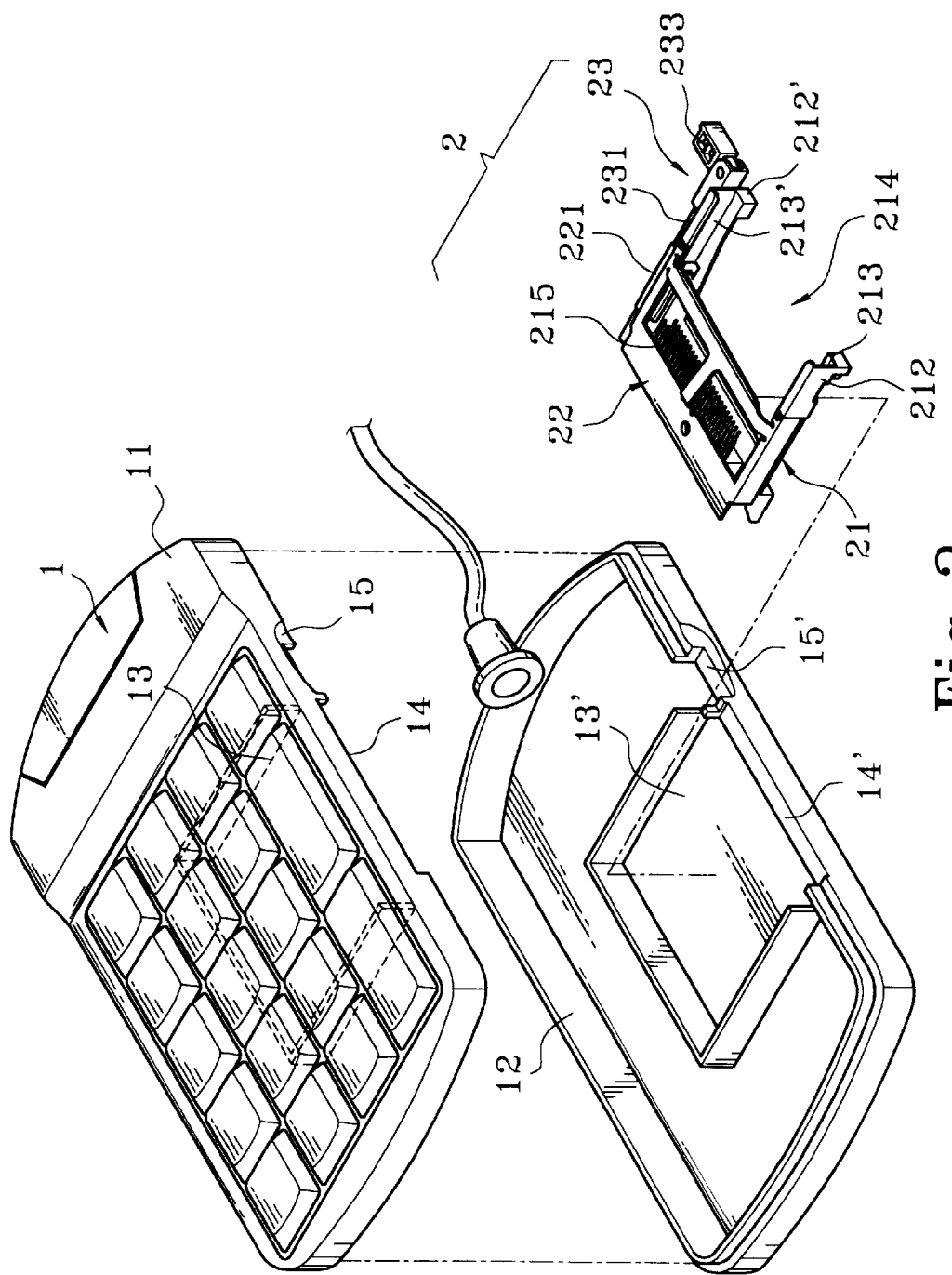
FIG. 2 is an exploded perspective view of the preferred embodiment.

With reference to FIGS. 1 and 2, which show a perspective view and an exploded perspective view of the present invention, the card insertable keypad of the present invention includes a housing and at least one card inserting means 2 formed within the housing 1 to enable insertion of a memory card. As a result, the keypad enables data in the memory card to be transferred to a computer for further processing, and data to be transferred from the computer into the memory card.

The aforesaid housing 1 is formed by an upper half 11 and a lower half 12. Each of the upper half 11 and the lower half 12 has a respective receiving portion 13, 13' for receiving the card inserting means 2. Each of the front edges of the two receiving portions 13, 13' has a notch 14, 14', respectively, and a recess 15, 15', respectively. Each of the notches 14, 14' is formed with an inlet for insertion of a memory card.

The card inserting means 2 is formed by a seat 21, a supporting means 22 and a pressing means 23. The seat 21 has a bottom portion 211. Two sides of the bottom portion 211 each are extended with respective guides 212, 212'. Each of the guides 212, 212' has a respective guide groove 213, 213. A space for insertion of the memory card is formed between the bottom portion 211 and the two guides 212 and 212'. After the memory card is inserted into the space 214, the memory card is connected with a connector 215 installed on the bottom portion 211. Furthermore, the supporting means 22 runs across the seat 21 and one side thereof has a pivotal portion 221 which is pivotally connected and can be acted on by the pressing means 23. The pressing means 23 is formed by a rod 231 and a driving portion 232. The rod 231 is pivotally connected to the pivotal portion 221. One end of the rod 231 is connected to one end of the driving portion 232. The center of the driving portion 232 is pivotally connected to the supporting means 22. One end of the driving portion 232 is operable in the space 214. The front end of the rod 231 is pivotally connected with a movable portion 233. This movable portion 233 is received in the lateral side of the card inserting inlet of the housing 1 and is flush with the edge of the keypad. Therefore, a novel keypad is formed.

Figure 3:
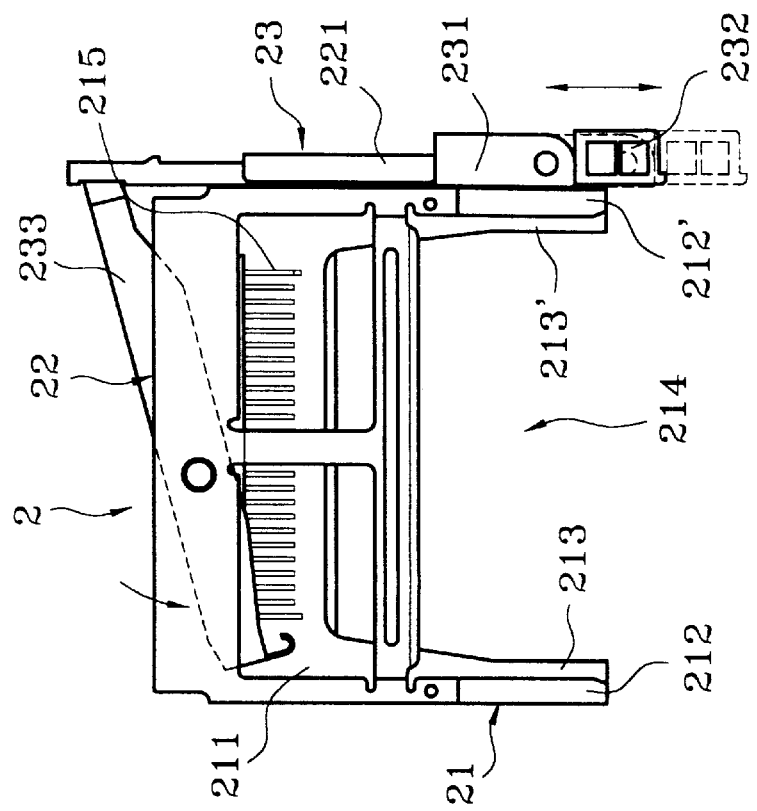
FIG. 3 is an upper plan view of the card inserting means of the present invention.
Figure 4:
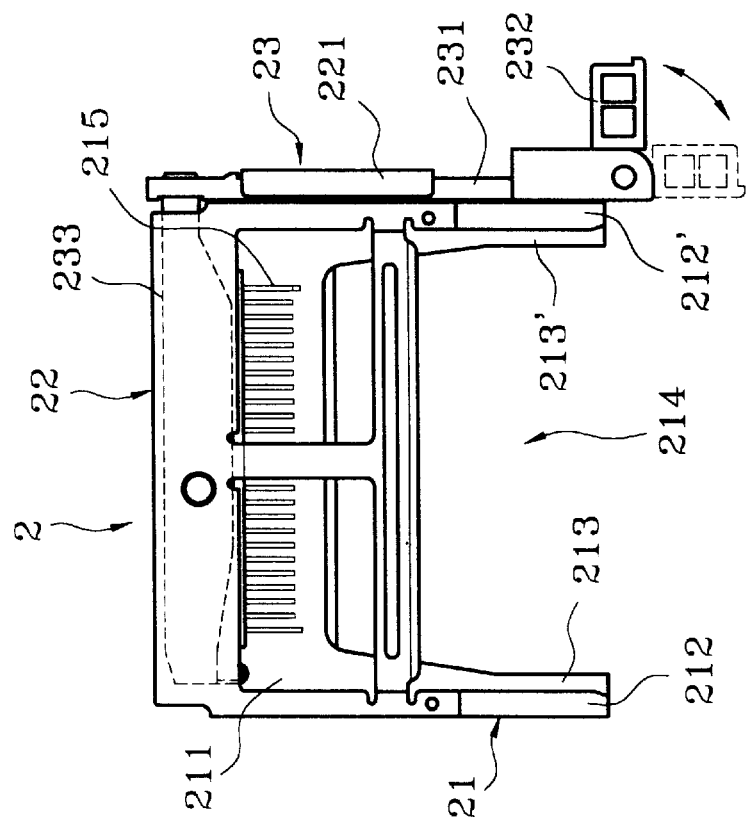
FIGS. 4–5 are plan views showing the operation of the card inserting means of FIG. 3.
Figure 5:
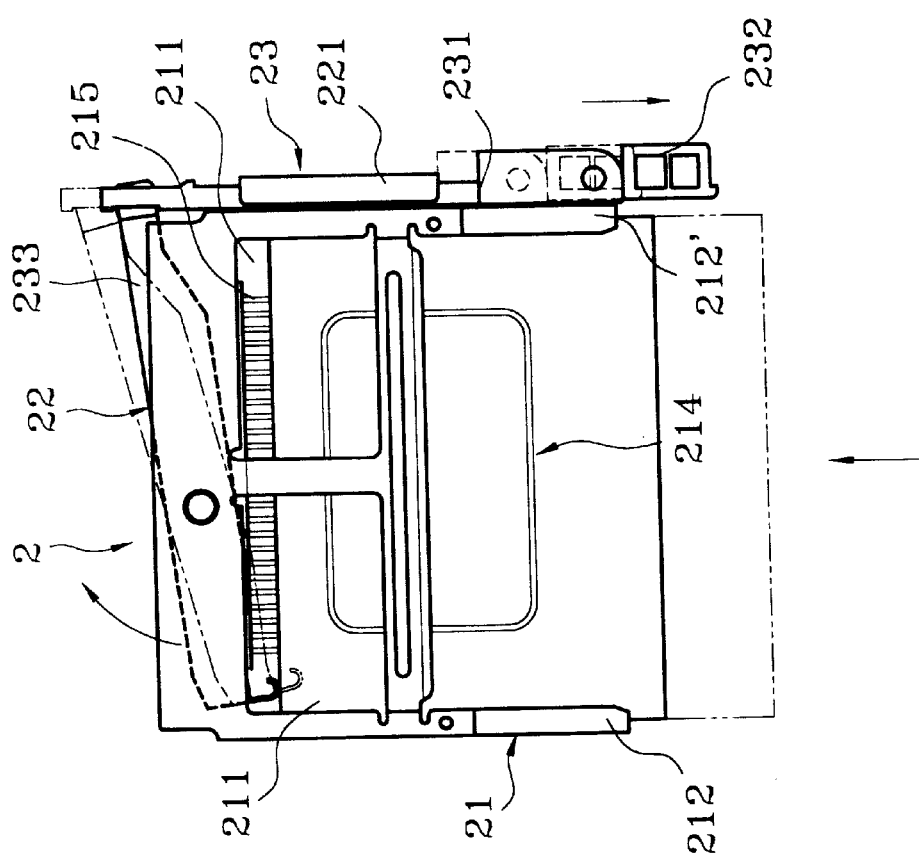

Referring to FIGS. 3, 4 and 5, in which upper and schematic views of the card inserting means of the present invention are illustrated, the memory card 3 (such as a compact flash memory, a smart media card, a multi-media memory card or a general IC card) is inserted into the card inserting means 2 along the guides 212, 212' of the card inserting means 2. At the time that the memory card 3 is connected to the connector 215, one end of the driving portion 232 is pressed into the card inserting means 2, at which time one end of the driving portion 232 drives the rod 231 to move outwards so that the front end of the rod extends out of the card inserting inlet. The user can move the movable portion 233 to one side. Then, the movable portion 233 is received in the recesses 15, 15' to be flush with the edge of the keypad so as not to affect use of the keypad. The user may operate the memory card 3 through the keypad for reading data in the computer, or storing the data back to the memory card 3.

When the memory card 3 is not used, the user may move the movable portion 233 inwards to drive the rod 231 so as to further drive one end of the driving portion 232, causing the memory card to be ejected so that the memory card 3 is separated from the connector 215. Therefore, the user may take the memory card 3 out.

One or two card inserting means 2 can be installed. Furthermore, in at least two keypads, the card inserting means of the different keypads can have different specifications, such as a U.S. specification or a Japanese specification, to enable insertion of memory cards 3 having different specifications. Therefore, the user may carry the keypad overseas or use it with cards of different specifications. Only one mainframe is needed to be connected to a computer.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A card-insertable keypad which serves as a computer peripheral, comprising:

a housing;

a single card inserting means installed within the housing;

wherein when a memory card is inserted by the card inserting means into the keypad, data in the memory card is sent to a computer to which the keypad is connected for processing, and data is sent from the computer to the keypad for storage in the memory card, whereby said keypad replaces a separate card reader.

2. The card-insertable keypad as claimed in claim 1, wherein the housing is formed by an upper half and a lower half.

3. The card-insertable keypad as claimed in claim 2, wherein each of the upper half and lower half has a respective receiving portion, the respective receiving portions of the upper half and the lower half each including a front edge, and the front edges of the respective receiving portions each having a notch and a recess.

4. The card-insertable keypad as claimed in claim 1, wherein the card inserting means is formed by a seat, a supporting means, and a pressing means.

5. The card-insertable keypad as claimed in claim 4, wherein the seat has a bottom portion; respective guides extend from two sides of the bottom portion; each of the guides has a respective guide groove; a space for insertion of the memory card is formed between the bottom portion and the guides; and the bottom portion is connected with a connector for transferring data to and from the memory card.

6. The card-insertable keypad as claimed in claim 4, wherein one side of the supporting means has a pivotal portion.

7. The card-insertable keypad as claimed in claim 5, wherein the pressing means is formed by a rod and a driving portion; one end of the rod is connected to one end of the driving portion; a center of the driving portion is pivotally connected to the supporting means; and one end of the driving portion is operable in the space between the bottom portion and the guides.

8. The card-insertable keypad as claimed in claim 7, wherein a front end of the rod is pivotally connected with a movable portion such that the movable portion may be moved by a user until it is received in a lateral side of a card inserting inlet of the housing and is flush with an edge of the keypad.

9. The card-insertable keypad as claimed in claim 1, wherein the memory card is selected from the group consisting of a compact flash memory, a smart media card, a multi-media card, and a general IC card.

* * * * *